United States Patent [19]

Dupuis

[11] 3,748,725

[45] July 31, 1973

[54] METHOD AND APPARATUS FOR MANUFACTURE OF INTEGRATED CIRCUIT DEVICES

[75] Inventor: Jean M. Dupuis, Kanata, Ontario, Canada

[73] Assignee: Microsystems International Limited, Montreal, Quebec, Canada

[22] Filed: Apr. 28, 1971

[21] Appl. No.: 138,044

[52] U.S. Cl. .................... 29/577, 29/628, 29/576 S

[51] Int. Cl. .................... B01j 17/00

[58] Field of Search .................. 29/576 S, 625, 577, 29/589, 590, 628; 174/DIG. 3

[56] References Cited

UNITED STATES PATENTS

| | | | |
|---|---|---|---|
| 3,431,637 | 3/1969 | Caracciolo | 29/588 |
| 3,341,649 | 9/1967 | James | 174/52 |
| 3,544,857 | 12/1970 | Byrne et al. | 317/234 |

*Primary Examiner*—Charles W. Lanham
*Assistant Examiner*—W. Tupman
*Attorney*—Alfred A. DeLuca

[57] ABSTRACT

A mass-production technique for the fabrication of integrated circuit packages is described. The integrated circuit devices are assembled on ceramic or like substrates and the contacts for the devices bonded to the substrates, using comb-like continuous strips of contact material which are brought to a bonding station. Individual substrates are also fed into the bonding station and each substrate bonded to the contact strips, whereafter the strips and attached substrates continue through further process stages towards the finished packaged devices.

10 Claims, 6 Drawing Figures

INVENTOR
JEAN M. DUPUIS
BY L. Brooke Kenaford
AGENT

INVENTOR
JEAN M. DUPUIS
BY L. Brooke Keneford
AGENT

METHOD AND APPARATUS FOR MANUFACTURE OF INTEGRATED CIRCUIT DEVICES

The present invention relates to the production of integrated circuit packages and in particular to a method of fabricating the contacts on such packages.

Integrated circuit packages are conventionally manufactured by bonding integrated circuit chips onto etched or stamped lead frames or onto suitable substrates having lead patterns deposited thereon. In the case of the lead frame method, the chip is then encapsulated and the perimeter of the frame removed to leave connecting leads for the device. In the method involving use of a substrate having a lead pattern deposited thereon, after bonding of the chip to the substrate, contacts are bonded to the edges of the substrate and the device then encapsulated.

The use of lead frames lends itself to mass-production techniques but has the disadvantage that there is no interchangeability between frames to suit different chip configurations. The tooling required for stamping or etching the lead frame is relatively expensive and pre-fabricated lead frames are therefore normally economical only in high volume runs adapted to one specific chip configuration. Supposing, for example, that the tooling is set to fabricate lead frames for the production of 14-lead packages and it is subsequently desired to switch to 18-, 22-, 26-, or 40-lead packages. Such a switch naturally involves modifying the lead frames, which is costly and time consuming.

The method of bonding the chip to a substrate having a lead pattern deposited thereon has the disadvantage that it is not suited to mass-production technique in that the contacts are normally brazed to the lead pattern ends and the metallization subsequently gold-plated. The present invention employs the general concept of using substrates having the lead patterns deposited thereon, but provides a means of attaching the contacts to the bases utilizing mass-production techniques and in such a way that apparatus may be switched quickly and without expense to fabricating packages having varying lead configurations.

The objects of the invention are accomplished by firstly depositing a lead pattern upon a suitable base — for example a ceramic base with the pattern deposited thereon by a "thick film" method — and secondly bringing the base into registry with two parallel rows of contacts, which contacts are then bonded to the lead pattern. Each row of contacts extends rather like the teeth of a comb from a strip of contact material. When the base is located between the row of contacts bonding between the contacts and the lead-ends on the base is effected, for example by thermal compression bonding. After the base is bonded to the contact strips, the whole assembly is moved away from the bonding station by movement of the contact strips. Conveniently, these strips are fed through a sprocket drive from a roller supply, the sprocket drive being programmed to advance the strip incrementally depending upon the size and configuration of the base being bonded. Thus, after each base is processed, the strips are moved along and another base is brought into registry with the strips for bonding. Typically, a gap of two or three contacts is left between successive bases, and these contacts are preferably removed from the strip at a subsequent work station. This results in the successive bases being separated by, say, a half inch of free space bounded by the edges of the strip. The removal of the surplus contacts between successive bases is desirable for subsequent encapsulation operations as will herein be explained.

The invention will now be described further by way of example only and with reference to the accompanying drawings in which.

Figure 2:
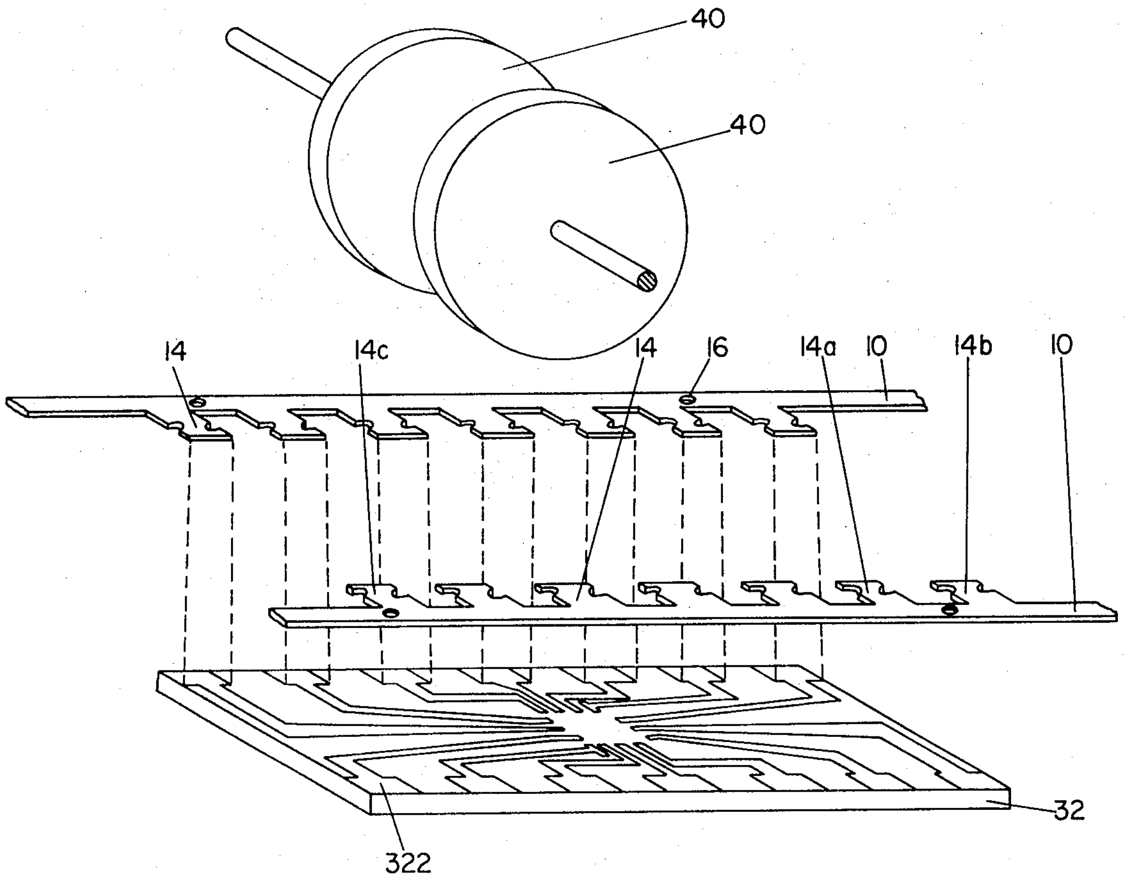
FIG. 2 is an enlarged view of parts of the apparatus of FIG. 1.
Figure 1:
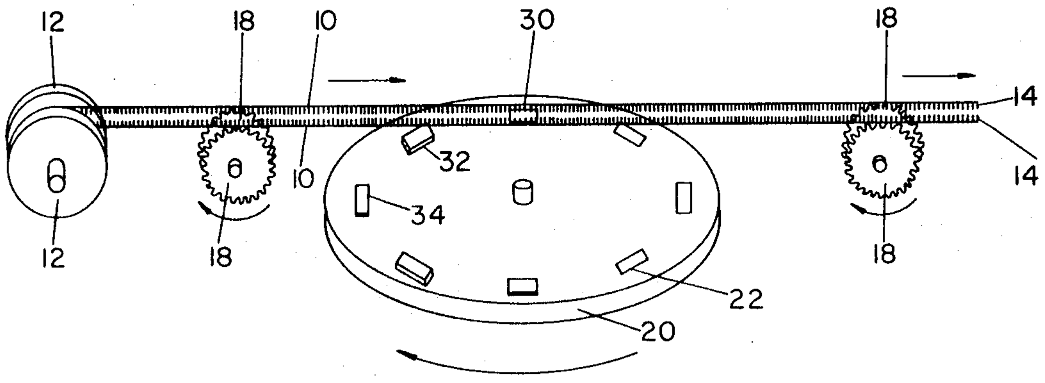
FIG. 1 is a perspective view apparatus for performing the method of the present invention.

Referring now to the drawings, and particularly FIGS. 1 and 2, parallel comb-like strips 10 of contact material are drawn from supply spools 12. The strips are provided with spaced inwardly extending portions 14 which constitute the contacts which are subsequently bonded to the ceramic bases as will hereinafter be described. At intervals along the continuous portions of the strips there are provided holes 16 (see FIG. 2) which engage with the teeth of drive sprockets 18. Sprockets 18 function to move the strips along from left to right in the drawing.

A turntable 20 is located with its axis lying perpendicular to the plane of the strips 10. The turntable 20 is provided with circumferentially spaced depressions or "nests" 22. The nests are dimensioned to receive ceramic bases upon which the lead patterns, to which the contacts 14 are to be bonded, have been deposited. The lead patterns are deposited by conventional "thick film" method, which method forms no part of the present invention. The table 20 is located with respect to the strips 10 in such a manner that the table may be rotated to bring the nests successively beneath the strips 10. The nests are further oriented so that as each one containing a ceramic base becomes beneath the strips 10, the sides of the base containing the lead-ends are exactly parallel with the strips 10 and the lead-ends are in registry with the contacts 14 to which they are to be bonded.

Consider for example the base 30 shown in FIG. 1. This base has been bonded to the strips 10 and the strips have now moved to the right in the drawing by an amount slightly more than the length of the base. The table 20 has now been rotated in the direction of the arrow in order to bring the next base 32 into position beneath the strips 10. Strips are then bonded to base 32 whereafter the strips are again moved to the right by an amount slightly more than the overall length of the base. Further rotation of the table 20 will now bring the base 34 into position beneath the strips 10, and the process is repeated for that base. Thus it will be realized that for a given size of base and number of contacts to be bonded thereto, the strips 10 are moved through successive incremental and identical amounts, which amounts are easily determined by suitable programming of the drive means for the sprockets system. Similarly, to bring successive bases into bonding position beneath the strips, table 20 is rotated in identical successive steps which again are easily programmed or mechanically interconnected with the drive means for the sprockets 18. As each base becomes bonded to the strip 10, and the table rotates to bring another base into bonding position, the nest in which the first base was located is now empty and is therefore ready to be replenished with another base before that particular nest once again comes into registry with the strips 10. This replenishment may take place either manually or by means of an automatic feed system. In the case of a manual feed, it is convenient to arrange means whereby the operator places a base into an empty nest and then actuates drive mechanism for the sprockets 18 which moves strips 10 along by one step and also turns table 20 to bring a fresh base into position beneath the strips 10. Alternatively, an automatic feed system is utilized, and the feed rate can be mechanically interlocked or programmed to correspond with the sprocket and table drive mechanism.

Referring now to FIG. 2, the method of bonding the contacts 14 to the lead-ends will now be described. As in FIG. 1, it will be assumed that base 32 is in registry with the strips 10 for bonding contacts thereto. The level of the table 20 shown in FIG. 1 is such that the surfaces of the lead-ends are very close to the lower surfaces of the contacts 14. Each nest 22 is adapted to be raised and is raised after coming into position with the base received therein in registry with the contacts 14, so that the lead-ends mate with the contacts and are ready for bonding thereto. Thus, the base 32 is raised in its nest 22, and thereafter the leadends 322 are bonded to the contacts 14 by thermal compression bonding, which is accomplished by means of heated rollers 40. Rollers 40 operate by cam action which presses each roller down on to two of the contacts **14*a* and 14*b* on each strip adjacent the leading end of the base and the cam action further causes the rollers to traverse the base until all the lead-ends on the base have their respective contacts bonded thereto. After the contact 14*c* on each strip adjacent the trailing end of the base has been bonded, the rollers 40 are lifted away from the contacts 14** and back to their original position in readiness to perform another cycle on the next base to be processed. The roller action is again either programmed or mechanically interlocked with the strip and table drive mechanisms.

Figures 3A, 3B, 3C, 3D:
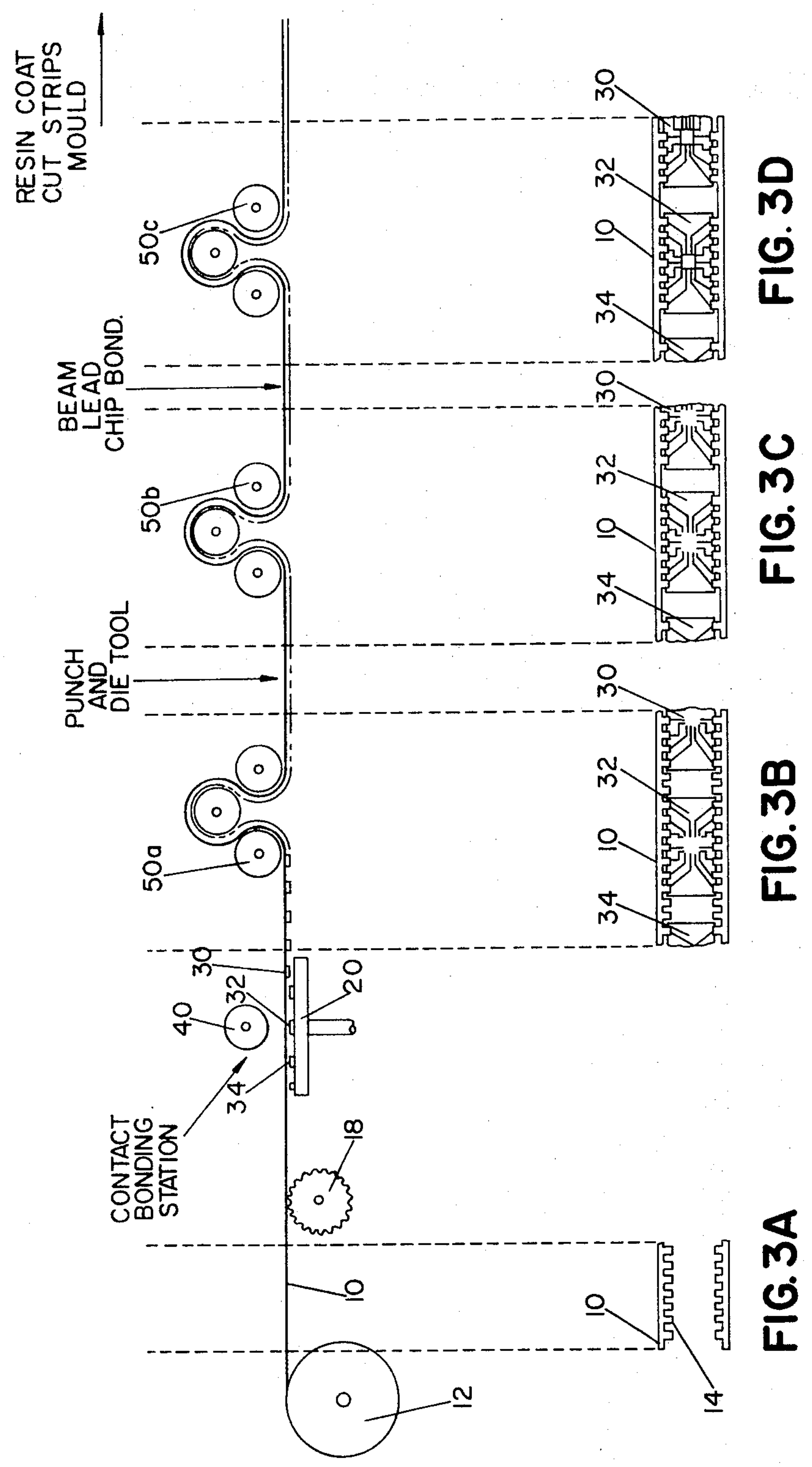
FIG. 3 is a schematic view of various stages in the manufacturing of a device of the method of the invention.

FIG. 3 shows part of a continuous assembly line for packages contructed in accordance with the present invention. After leaving the feed spool 12, each strip 10 passes over a drive sprocket 18 and over the table 20. Upon leaving the spool 12, the strips 10 and their contacts 14 appear as in FIG. 3A. In FIG. 3 a base 30 is shown as having just been bonded to the contacts 14 and the strips 10 have moved to the right in the drawing thereby bringing a fresh strip section into registry with the next base 32 which is to be bonded. It may be noticed that the table 20 has rotated so that the base 32 is now immediately beneath the strips 10 to the contacts of which it is to be bonded by the action of the heat rollers 40. For the purpose of illustration, consider the three consecutive bases 30, 32 and 34 as they pass along the assembly line toward the finished product. After leaving the contact bonding station, the strips 10 pass over tension wheels **50*a* and on to a punch and dye tool station. Prior to reaching the punch and dye tool station, the contact strip now appears as shown in FIG. 3B with the ceramic bases 30, 32 and 34 being separated typically by two contact spaces on the strips. At this stage, these contacts between consecutive bases are intact. However, for reasons which will be explained hereinafter, it is desirable to remove those intervening contacts and for this purpose, strips 10 pass through the punch and dye tool station, from which the strips emerge appearing as shown in FIG. 3C. The strips pass over a second tension reel assembly 50*b* to a lead chip bonding station. Here, the device chips are bonded to the leads in the centre of the bases using well known and conventional production-line techniques, for example beam-lead bonding. The strips emerge from the lead chip bonding station appearing as in FIG. 3D, and pass once more over tension rollers 50*c*.** From hereon, the strips and their associated devices pass through first and second resin coating operations. In the first coating operation, a definite amount of atomised resin is applied over the area of the chip and this is followed by a 150° cure in an in-line oven. The strips then pass through the second coating operation which is similar to the first with the exception that the cure is done in air.

After leaving the second resin coating stage, the strips pass through a cutting stage wherein they are cut to lengths suitable for the final molding operation. Typically, the strips will be cut into lengths containing six or seven devices, and the molding operation is carried out employing conventional techniques. It is in connection with this dual molding operation that it is desirable that the surplus contacts between successive devices on the strip leaving the contact bonding station be removed at the punch and dye tool station. If these contacts were not removed, they would tend to interfere with the molding operation by impeding the smooth flow of mold around the ends of the devices and becoming encapsulated themselves in the molding materials.

After leaving the molding station, the strips are finally cut up to yield the individual packages and the strips 10 removed from the contacts 14, the contacts extending from the sides of each package being thereafter turned down if a "dual in-line" configuration is required. Otherwise, of course, they may be left extending horizontally if "flat-pack" packages are required.

It will be appreciated that all of the various steps in the operation may conveniently be programmed and interlocked into the complete assembly-line system so that the system readily lends itself to completely automatic operation.

As explained above, one particular advantage of this system is its flexibility where packages of different contact configuration are required. For example, in the drawings, the devices shown are of fourteen-lead configuration. Assume now that a batch of 26-lead devices is required, and furthermore that these devices have a greater width than the previous 14-lead devices. In order to more fully illustrate the flexibility of the system, let it further be assumed that the spacing of the contacts on the 26-lead devices is different to that on the 14-lead devices. Firstly, the strips 10 having the 14-lead contact spacing are severed between their feed spools 12 and their drive sprockets 18 and surplus strip remaining at the contact bonding station removed. The spools 12 are then replaced with new spools containing strip having the required contact spacing of the new devices to be fabricated. Conveniently, the feed spools are freely located upon a common shaft provided with stops to axially locate the spools with a desired separation therebetween. Separation between the spools is of course determined by the width of the devices to be fabricated. Each strip 10 is then simply pulled from the spools and threaded onto the drive sprockets 18. In order to accommodate the new devices, the nests 22 may be quickly removed and replaced with new nests of the appropriate dimensions to accommodate the 26-lead devices to be fabricated. Alternatively, the table may be replaced by a new table having the appropriate nests. The contact bonding station is finally made ready to receive the new devices by adjusting the throw of the rollers 40 to accommodate the extra contacts. Appropriate adjustments can be made to the subsequent stations along the production line.

Clearly, many modifications from the embodiment specifically described above will be readily apparent to those skilled in the art without departing from the spirit and scope of the invention. For example, it is not necessary that the bases be processed through the bonding stage minus the integrated circuit chips. The chips can be located on the bases prior to their introduction to the bonding station. Furthermore, the particular drive means — sprockets — described for passing the strips through the apparatus are only by way of example. Alternative means, e.g. friction rollers, might equally well be used. As a further alternative to the specific method described, the strips can be severed to separate the bases in the final stage of the operation by simply severing the attachment points of the contacts to the remainder of the strip material, instead of firstly severing the strip material between bases.

What is claimed is:

1. In a method for the manufacture of integrated circuit devices which comprises providing for each device a generally rectangular base having disposed thereon a pattern of leads extending from an integrated circuit chip receiving region on said base to each of two parallel sides of said base, said leads terminating in either of two parallel rows of equally spaced lead ends, each row being adjacent and substantially parallel to a corresponding side of said base, the improvement which comprises:

a. sequentially presenting via first feed means said bases to a work station and simultaneously presenting via second feed means two parallel comb-like strips of contact material to said work station, said comb-like strips having teeth terminating in a continuous series of equally spaced parallel contacts for said bases, the spacing of said teeth corresponding to the spacing of the lead-ends along a row;
b. mating said lead ends with said contacts on said strips at said work station;
c. thermal-compression bonding said contacts to said lead ends;
d. mechanically severing said strips to separate said bases one from another; and
e. mechanically removing surplus strip material linking said contacts in order to leave said contacts freely extending from said bases.

2. The method of claim 1 wherein said strips are fed from supply spools.

3. The method of claim 1 wherein said strips are perforated and the perforations thereof engage with sprocket means for feeding said strips to said bonding station.

4. The method of claim 1 wherein said bases are sequentially brought to a bonding station by means for raising each said base to mate said lead ends with said contacts as aforesaid.

5. The method of claim 4 wherein said bases are brought into proximity with said bonding station by turntable means having nests therein spaced at regular intervals along a circle coaxial with said turntable and shaped to receive said bases, each of said nests being elevatable in order to present a base located therein to said contact strips and to mate said lead-ends with said contacts.

6. The method of claim 1 wherein surplus contacts between adjacent bases bonded to said contact strips are removed prior to severing of said strips to separate said devices.

7. The method of claim 6 wherein said integrated circuit chip is located upon said base subsequent to the bonding of contacts to said lead-ends as aforesaid, and each device is resin encapsulated prior to severing said strips to separate said devices.

8. A method for the manufacture of integrated circuit devices which comprises:

a. providing for each device a generally rectangular base having disposed thereon a pattern of leads extending from an integrated circuit chip receiving region on said base to each of two parallel sides of said base whereat said leads terminate in a row of equally spaced contact pads, each row being adjacent and substantially parallel to a corresponding side of said base;
b. providing two parallel comb-like strips of contact material fed by feed means substantially continuously from supply means therefor through a work-station, said comb-like strips having teeth terminating in a continuous series of equally spaced parallel contacts for said bases, the spacing of said teeth corresponding to the spacing of the lead-ends along a row;
c. feeding said bases to said work-station via feed means in such manner as to mate said lead ends on said bases with said contacts on said comb-like strips and thermal-compression bonding said contacts to said lead ends;
d. driving said strips to successively bring said bases attached thereto to a punch-station whereat surplus contacts between adjacent bases are removed;
e. driving said strips further to bring said bases from said punch-station to a chip deposit station whereat each said base has an integrated chip deposited thereupon in registry with and bonded to said lead pattern on said base;
f. driving said strips further to bring said bases from said chip deposit station to one or more encapsulation stations whereat said integrated circuit and base are encapsulated;
g. mechanically severing said strip between successive devices in order to separate said devices one from another, and
h. mechanically removing surplus strip material linking said contacts to leave said contacts freely extending from said bases.

9. The method of claim 1 wherein said integrated circuit chip is a beam-lead device.

10. The method as defined in claim 1 wherein the contacts associated with each comb-like strip are progressively bonded to the lead ends mating with said strip, and wherein diametrically or numerically corresponding contacts on each parallel comb-like strip are simultaneously bonded.

* * * * *